(12) United States Patent
Do et al.

(10) Patent No.: US 6,587,014 B2
(45) Date of Patent: Jul. 1, 2003

(54) SWITCH ASSEMBLY WITH A MULTI-POLE SWITCH FOR COMBINING AMPLIFIED RF SIGNALS TO A SINGLE RF SIGNAL

(75) Inventors: Thinh Dat Do, Fountain Valley, CA (US); Thuan Nam Tran, Fountain Valley, CA (US); Charles R. Gentzler, Thousand Oaks, CA (US)

(73) Assignee: Paradigm Wireless Communications LLC, Irvine, CA (US)

( * ) Notice: Subject to any disclaimer, the term of this patent is extended or adjusted under 35 U.S.C. 154(b) by 0 days.

(21) Appl. No.: 09/769,709

(22) Filed: Jan. 25, 2001

(65) Prior Publication Data

US 2001/0040485 A1 Nov. 15, 2001

Related U.S. Application Data

(60) Provisional application No. 60/177,904, filed on Jan. 25, 2000.

(51) Int. Cl.[7] .................................................. H01P 1/10
(52) U.S. Cl. ...................................... 333/101; 333/105
(58) Field of Search ................................ 333/101, 127, 333/125, 106

(56) References Cited

U.S. PATENT DOCUMENTS

| | | | |
|---|---|---|---|
| 3,581,244 A | 5/1971 | Smith | 333/17 |
| 3,614,647 A | 10/1971 | Seidel | 330/124 |
| 3,701,054 A | * 10/1972 | Hagler et al. | 333/1.1 |
| 3,919,660 A | 11/1975 | Beurrier | 330/185 |
| RE29,844 E | 11/1978 | Seader et al. | 330/293 |
| 4,390,851 A | 6/1983 | Higgins et al. | 330/277 |
| 4,500,847 A | 2/1985 | Hallford | 330/777 |
| 4,564,817 A | 1/1986 | Gilson et al. | 330/786 |
| 4,647,871 A | 3/1987 | Turner, Jr. | 330/298 |
| 4,972,425 A | 11/1990 | Braski | 372/32 |
| 5,025,233 A | * 6/1991 | Leonakis | 333/128 |
| 5,036,228 A | 7/1991 | Noro | 307/491 |
| 5,134,311 A | 7/1992 | Biber et al. | 307/270 |
| 5,177,453 A | 1/1993 | Russell et al. | 330/284 |
| 5,202,649 A | 4/1993 | Kashiwa | 333/33 |
| 5,256,987 A | 10/1993 | Kibayashi et al. | |
| 5,268,601 A | 12/1993 | Cossins | 307/491 |
| 5,374,966 A | 12/1994 | Weigand | 348/707 |
| 5,394,061 A | 2/1995 | Fujii | 315/111.21 |

(List continued on next page.)

FOREIGN PATENT DOCUMENTS

WO        WO 97/41642        11/1997

*Primary Examiner*—Robert Pascal
*Assistant Examiner*—Joseph Chang
(74) *Attorney, Agent, or Firm*—Knobbe Martens Olson & Bear LLP

(57) ABSTRACT

A switch assembly has a housing and a plurality of controllable switches. The housing has a plurality of input ports and an output port and the plurality of individually controllable switches is arranged within the housing. Each switch has an open position and a closed position and is coupled to one of a plurality of input ports of the housing and a common summing junction within the housing. Each input port receives a coherent radio frequency (RF) signal. The output port is coupled to the common summing junction and outputs a sum signal that includes at least one of the RF signals received at the common summing junction when a switch is in the closed position. The switch assembly may further include impedance matching lines that transform a reference impedance value to a higher value prior to switching and an impedance transformation line that provides for the reference impedance value at a distal end of the impedance transformation line. The impedance transformation lines may be located outside the housing, inside the housing or inside and outside the housing. Further, the switch assembly may include at least one matching stub associated with the output port.

11 Claims, 12 Drawing Sheets

U.S. PATENT DOCUMENTS

| | | | |
|---|---|---|---|
| 5,423,074 A | 6/1995 | Dent | 455/74 |
| 5,440,281 A * | 8/1995 | Wey et al. | 333/126 |
| 5,448,182 A | 9/1995 | Countryman et al. | 326/30 |
| 5,473,281 A | 12/1995 | Honjo | 330/286 |
| 5,564,086 A | 10/1996 | Cygan et al. | 455/126 |
| 5,576,662 A | 11/1996 | Price et al. | 330/277 |
| 5,760,650 A | 6/1998 | Faulkner et al. | 330/286 |
| 5,767,755 A * | 6/1998 | Kim et al. | 333/101 |
| 5,834,975 A | 11/1998 | Bartlett et al. | 330/278 |
| 5,856,758 A | 1/1999 | Joffe et al. | 330/85 |
| 5,859,567 A | 1/1999 | Black | 330/279 |
| 5,872,481 A | 2/1999 | Sevic et al. | |
| 5,872,491 A * | 2/1999 | Kim et al. | 333/101 |
| 5,914,640 A | 6/1999 | Nasserbakht | 330/294 |
| 6,252,871 B1 | 6/2001 | Posner et al. | 370/360 |
| 6,323,742 B1 * | 11/2001 | Ke | 333/127 |

\* cited by examiner

SWITCH ASSEMBLY WITH A MULTI-POLE SWITCH FOR COMBINING AMPLIFIED RF SIGNALS TO A SINGLE RF SIGNAL

REFERENCE TO RELATED APPLICATION

This application claims the benefit of priority under 35 U.S.C. §119(e) of U.S. Provisional Application No. 60/177,904 filed Jan. 25, 2000, which is herewith incorporated by reference.

FIELD OF THE INVENTION

The invention relates to the field of splitting and combining radio frequency (RF) signals. More particularly, the invention relates to a switch assembly that selectively combines coherent RF signals to a single RF signal.

BACKGROUND OF THE INVENTION

Switches and power amplifiers are widely used in electronic apparatuses and systems. One exemplary application for switches and power amplifiers is within a base (transmitter) station that serves in a mobile communications system as an interface between mobile phones, such as cellular phones, and a mobile switching center. Each base station serves the mobile phones within an assigned geographical service area, e.g., a cell in a cellular system, and handles all radio traffic to and from the mobile phones. In order to adequately serve the service area, that is, to reach all mobile stations within the service area (i.e., near or remote), each base station includes a power amplifier section that amplifies a transmit signal prior to feeding it to an antenna of the base station. The power amplifier section is configured to provide an output power that is sufficiently high so that the emitted transmit signal reaches the mobile station with a power level that is sufficient to be detected and processed by the mobile station.

A typical base station includes several individual power amplifier modules that are combined so that the base station meets predefined output power requirements. Outputs of the power amplifier modules are connected to combine amplified coherent signals to one output signal that is provided to the antenna. This technique of combining individual power amplifier modules, rather than using one large power amplifier, has the benefit of increased reliability because each power amplifier module is a complete separate system and can function without any other power amplifier modules operating. But, since the number of combined power amplifier modules is typically four or less, the removal or failure of just one module may cause a significant power loss of the output signal.

For example, a conventional N-way combiner combines the coherent RF signals to a single output signal. If the base station includes four power amplifier modules, the N-way combiner has four input ports connected to the power amplifier modules and one output port coupled to the antenna. A failure of just one of the four power amplifier modules causes the power of the output signal to drop by 50%, and the failure of two power amplifier modules causes the power of the output signal to drop by 75%. This is caused by the limitations of the conventional N-way combiner where any difference of power between the input ports of the N-way combiner is dissipated in its isolation resistors or, in designs without isolation resistors, is reflected back to the power amplifier modules that remain in operation.

Other combiners are based on a different principle. It is known that the impedance at one end of a transmission line having an electrical length that corresponds to 180 degrees (i.e., one-half wavelength) is the same as at the line's second end. Therefore, when one end of the line is "open," the second end of the line will act also as an "open." This principle applied in the prior art, a mechanical switch is placed exactly 180 degrees from a summing point, which is the point at which the individual amplified RF signals are combined. The position of the mechanical switch with respect to the summing point provides an "open" end when the mechanical switch is opened so as to avoid creating an unknown impedance or a short at the summing junction. Individual power amplifier modules can then be removed from the combiner without dramatically effecting the overall performance.

However, one limitation of this principle is that in frequency bands commonly used in mobile communications systems, from around 800 MHz to above 2 GHz, the wavelengths of the signals at these frequency bands are relatively short. This usually requires the transmission lines to have multiple 180-degree sections to meet the mechanical spacing requirements between amplifier modules. This, however, results in a reduced bandwidth, often too small for many applications.

Further, an exact impedance match can only be achieved for a defined number of power amplifier modules. For example, in a design optimized for four power amplifier modules, if two power amplifier modules fail or are removed, the resulting loss, in addition to loss caused by the combiner, is about 0.5 dB or another 12%. With all but one power amplifier module operating, the additional loss increases to approximately 35%. As a compromise, the combiner is, in some cases, configured for an optimum match with three power amplifier modules instead of four power amplifier modules so that the loss is more balanced as power amplifier modules are removed or added.

In order to overcome the impedance problem it is known to switch additional 90-degree (i.e., one-quarter wavelength) transmission lines in and out to maintain a good match regardless of how many power amplifier modules are switched in and out. As the number of power amplifier modules is changed, the impedance of a 90-degree length of the transmission line is changed to maintain a good impedance match under all operating conditions. Such an approach, however, requires many mechanical switches and considerable physical area to achieve a desired performance.

SUMMARY OF THE INVENTION

There is, therefore, a need for an improved technique for combining RF signals which is easy to implement and provides for loss-less combining.

An aspect of the invention is therefore a switch assembly having a housing and a plurality of controllable switches. The housing has a plurality of input ports and an output port and the plurality of individually controllable switches is arranged within the housing. Each switch has an open position and a closed position and is coupled to one of a plurality of input ports of the housing and a common summing junction within the housing. Each input port receives a radio frequency (RF) signal. The output port is coupled to the common summing junction and outputs a sum signal that includes at least one of the RF signals received at the common summing junction when a switch is in the closed position.

In preferred embodiments, the switch assembly includes further impedance matching lines that transform a reference impedance value to a higher value prior to switching and an impedance transformation line that provides for the reference impedance value at a distal end of the impedance transformation line. The impedance transformation lines may be located outside the housing, inside the housing or inside and outside the housing. Further, the switch assembly may include at least one matching stub associated with the output port.

Another aspect of the invention involves a switch assembly having a housing, a plurality of controllable switches and a plurality of impedance transformation lines. The housing has a plurality of input ports and an output port. The plurality of controllable switches is arranged within the housing. Each switch has an open position and a closed position and is coupled to one of a plurality of input ports of the housing and a common summing junction within the housing. Each input port is configured to receive a radio frequency (RF) signal, wherein the output port is coupled to the common summing junction and is configured to output a sum signal that includes at least one of the RF signals received at the common summing junction when a switch is in the closed position. A first impedance transformation line is coupled to one of the plurality of input ports of the housing, and a second impedance transformation line is coupled at a first end to the common summing junction. Each first impedance transformation line is configured to transform a reference impedance value at the input port to a higher impedance value, wherein the second impedance transformation line is configured to provide for the reference impedance value at a second end of the second impedance transformation line. At least one matching stub is coupled to the second impedance transformation line.

A further aspect of the invention involves a switch assembly having a housing, a plurality of controllable switches, and a plurality of impedance transformation lines. The housing has a plurality of input ports and an output port. The plurality of controllable switches is arranged within the housing. Each switch has an open position and a closed position and is coupled to one of a plurality of input ports of the housing and a common summing junction within the housing. Each input port is configured to receive a radio frequency (RF) signal, wherein the output port is coupled to the common summing junction and is configured to output a sum signal that includes at least one of the RF signals received at the common summing junction when a switch is in the closed position. A first impedance transformation line is coupled to one of the plurality of input ports of the housing, and a second impedance transformation line is coupled at a first end to the common summing junction. Each first impedance transformation line is configured to transform a reference impedance value at the input port to a higher impedance value, wherein the second impedance transformation line is configured to provide for the reference impedance value at a second end of the second impedance transformation line. At least one internal matching stub is coupled to the second internal impedance transformation line.

Another aspect of the invention involves a method of matching impedances of transmission lines using a switch assembly. The method receives at a plurality of input ports radio frequency (RF) signals and selectively operates switches between open positions and closed positions to selectively couple the RF signals to a common summing junction. The method outputs a sum signal at an output port that includes at least one of the RF signals.

Another aspect of the present invention involves an amplifier section for amplification of a radio frequency (RF) signal. The amplifier section includes amplifier modules, a combiner, first impedance transformation lines and a second impedance transformation line. Each amplifier module has an input port to receive the RF signal and an output port for an amplified RF signal, wherein the input ports is connectable to a splitter. The combiner has input ports each being coupled to an output port of an amplifier module to receive the amplified RF signal and an output port for a single RF signal formed by a combination of the amplified RF signals. The combiner has controllable switches each assigned to one of the amplifier modules to selectively connect and disconnect the amplifier module. The first impedance transformation lines are interconnected at the input ports of the combiner between the combiner and the amplifier modules. Each first impedance transformation line transforms a reference impedance value of a reference line to a first value of an input impedance at the input port, wherein the first value of the input impedance is higher than the reference impedance value. The second impedance transformation line is connected to the output port of the combiner and transforms a second value of an output impedance to the reference impedance value, wherein the second value is lower than the reference impedance value.

BRIEF DESCRIPTION OF THE DRAWINGS

These and other aspects, advantages, and novel features of the invention will become apparent upon reading the following detailed description and upon reference to the accompanying drawings. In the drawings, same elements have the same reference numerals.

DETAILED DESCRIPTION OF PREFERRED EMBODIMENTS

The present invention is described hereinafter with reference to one embodiment of a switch assembly used in a mobile communications system illustrated in FIG. 1. However, it is contemplated that the invention is generally applicable in apparatuses and circuits in which coherent high frequency signals are combined to a single signal and in which losses after failure or removal of one or more high frequency signals need to be avoided.

Figure 1:
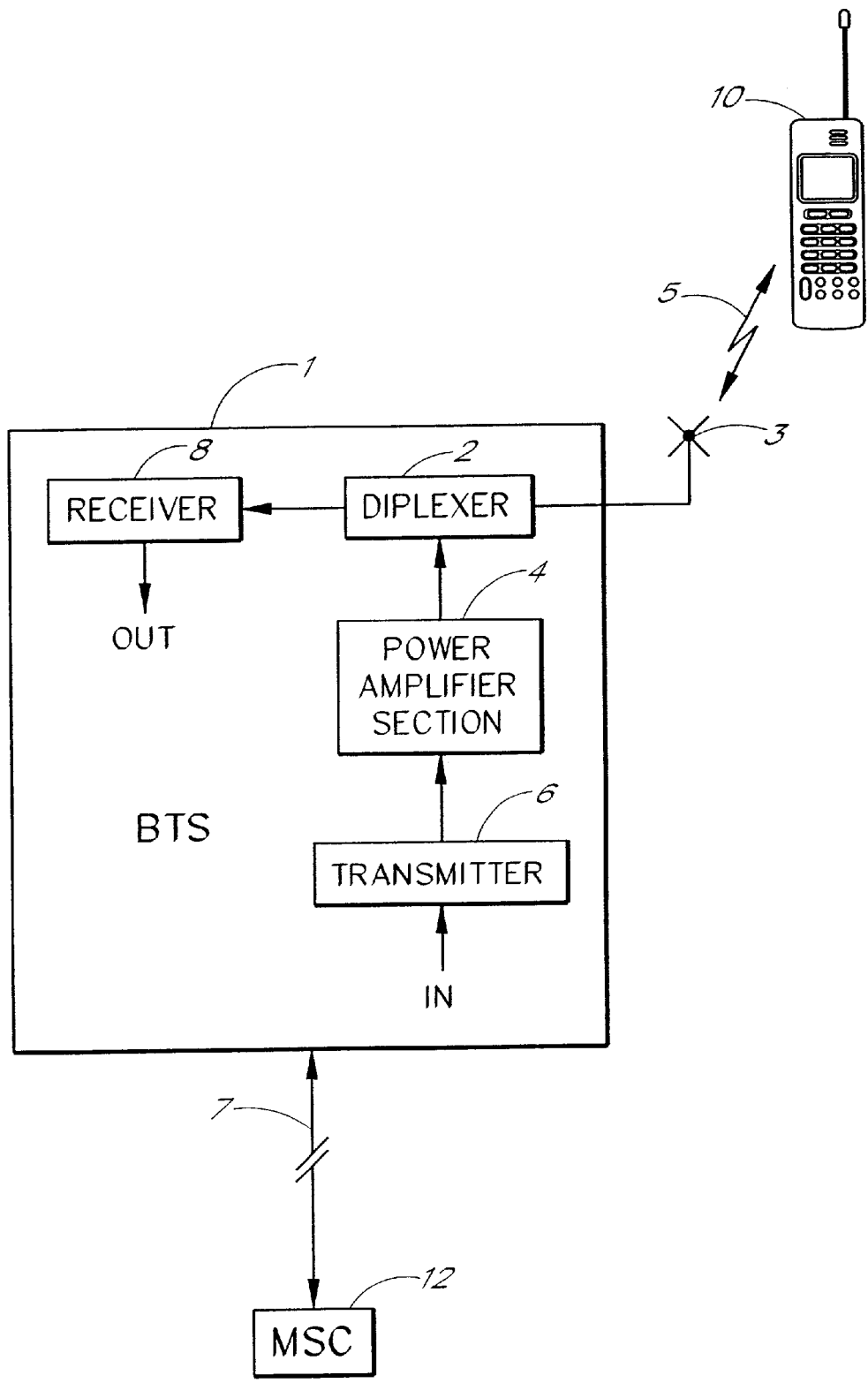
FIG. 1 is an illustration of a communications system having a base station that includes a power amplifier section.

The exemplary mobile communications system illustrated in FIG. 1 includes a mobile station 10, a base (transmitter) station 1 and a mobile switching center (MSC) 12 coupled to the base station 1 via a communications line 7. Although only one mobile station 10 and only one base station 1 are shown, it is contemplated that the mobile communications system includes a plurality of mobile stations 10 and a plurality of base stations 1 associated with the mobile switching center 12. The base station 1 communicates via a radio frequency (RF) signal 5 with the mobile station 10 within a service area assigned to the base station 1. The mobile switching center 12 provides access to a fixed telecommunications network, e.g., the public services telephone network (PSTN), to other base stations 1, or to another mobile communications system.

As illustrated in FIG. 1, the base station 1 includes a transmit path and a receive path both of which are coupled to an antenna 3 via a diplexer 2. The receive path includes a receiver 8 connected to the diplexer 2 and configured to convert the received RF signal to an output signal OUT of a lower frequency. The output signal OUT may be further processed within the base station 1 or forwarded to the mobile switching center 12 for processing within the switching center 12. The transmit path includes a transmitter 6 and an amplifier section 4 which is interconnected between the transmitter 6 and the diplexer 2. As the amplifier section 4 often includes power amplifiers, it is hereinafter, without limitation, referred to as the power amplifier section 4. The transmitter 6 receives a low-frequency baseband input signal IN and converts it to a RF signal that the power amplifier section 4 amplifies prior to sending it to the antenna 3. It is contemplated that in one embodiment the power amplifier section 4 and the transmitter 6 may be combined to a single unit.

Figure 2:
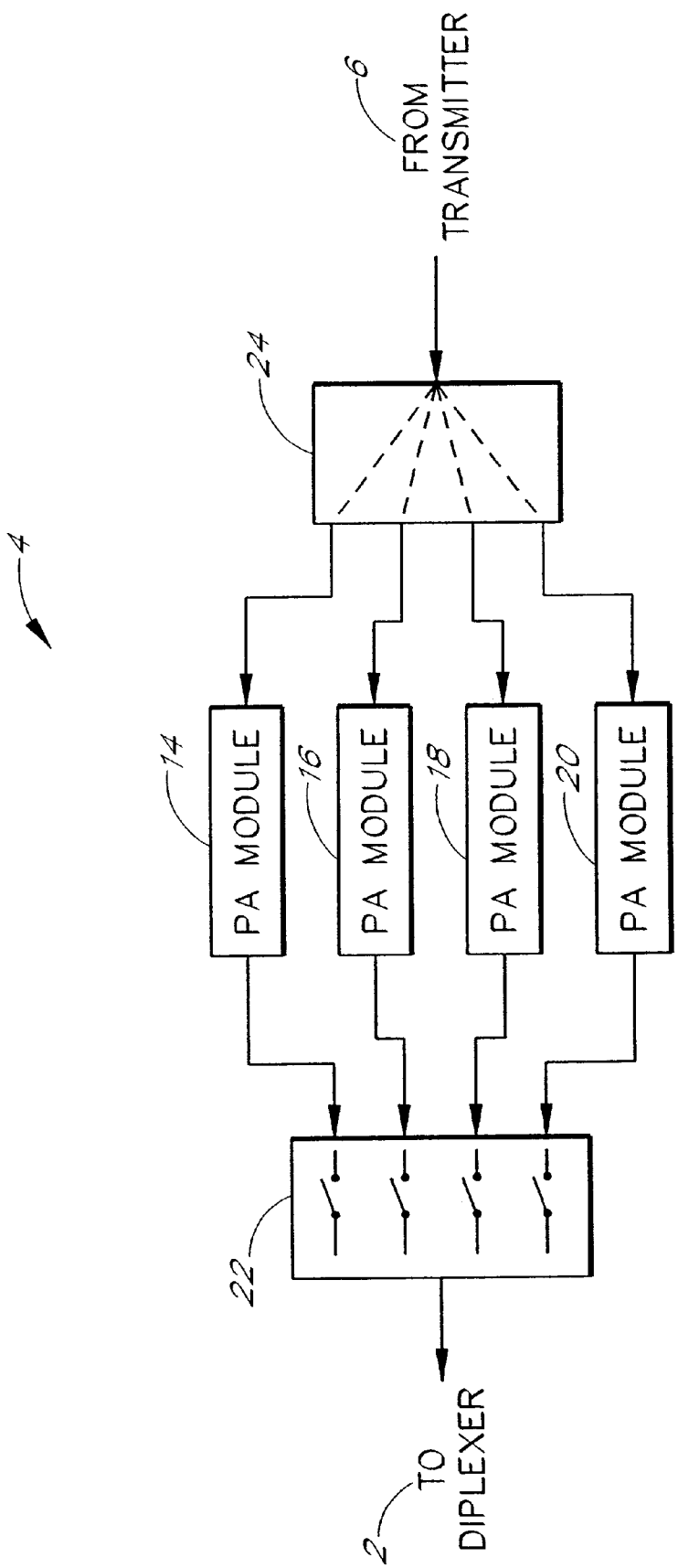
FIG. 2 is an illustration of the power amplifier section shown in FIG. 1 having four power amplifier modules connected in parallel between a splitter and a combiner.
Figure 8:
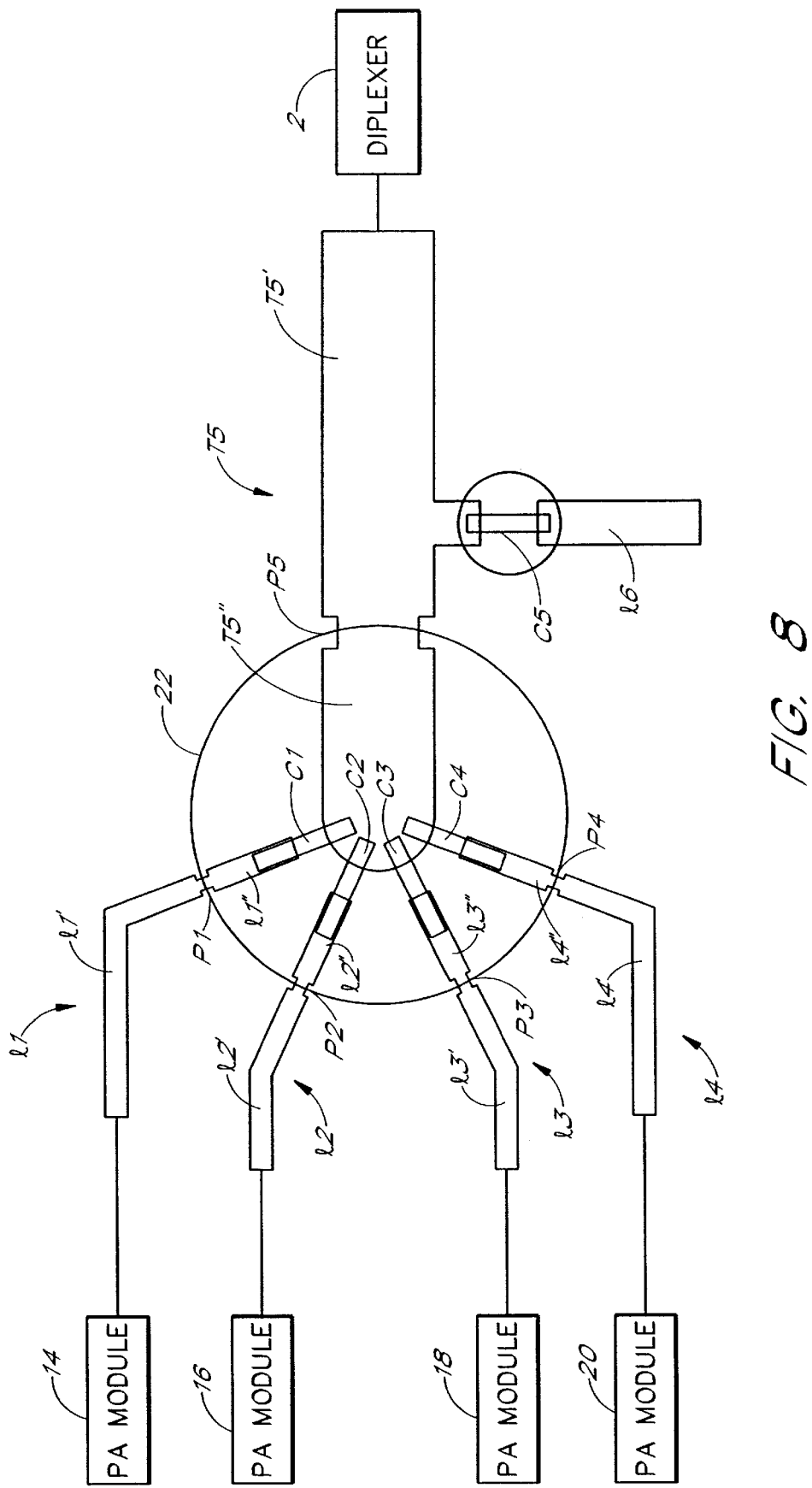
FIG. 8 is an illustration of an embodiment of the multi-pole switch connected to impedance transformation lines, wherein a matching stub is coupled to an impedance transformation line coupled to an output port of the multi-pole switch.

FIG. 2 is an illustration of the power amplifier section 4 that is connected between the diplexer 2 and the transmitter 6 as shown in FIG. 1. FIG. 2 shows the flow of the RF signal to illustrate the principal structure of the power amplifier section 4 in accordance with the present invention. An illustration of the power amplifier section 4 that shows the flow of the RF signals and the control signals is shown in FIG. 8 and described below. In the illustrated embodiment, the power amplifier section 4 includes four power amplifier modules 14, 16, 18, 20 connected in parallel between a splitter 24 and a combiner 22.

The splitter 24 receives the RF signal from the transmitter 6 and splits it into four individual coherent RF signals which have power levels that are about one fourth of the power level prior to splitting the RF signal. The splitter 24 forwards the individual coherent RF signals to the power amplifier modules 14–20 for amplification to a predetermined power level. In one embodiment, the splitter 24 is a passive junction, or a switch with isolators to prevent undesired reflections. The combiner 22 receives the amplified coherent RF signals and combines the signals to a single output signal.

As described below, the combiner 22 includes a switch assembly that is in one embodiment a multi-pole switch in accordance with the present invention. Each switch of this multi-pole switch is connected via a transmission line to an output port of one power amplifier module 14–20 and internally to a common output port of the multi-pole switch. The common output port represents a summing junction. The individual coherent RF signals (hereinafter "the RF signals") of the power amplifier modules 14–20 are combined to a single RF output signal which is available at the common output port of the combiner 22. The common output port is also connected to an impedance transformation line. The location of the multi-pole switch downstream of the power amplifier modules 14–20 contributes to the improved performance of the power amplifier section 4 and, thus, of the base station 1 as described hereinafter.

Figure 3B:
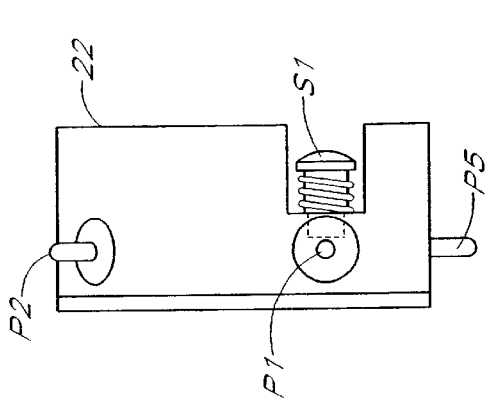
FIGS. 3A–3E show various views and details of a first embodiment of a multi-pole switch included in the combiner.
Figure 3D:
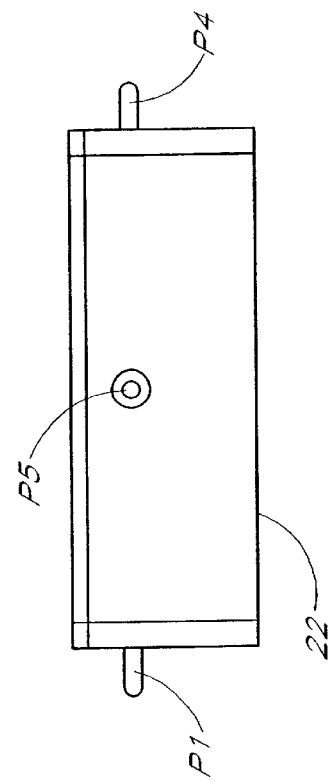
Figure 3A:
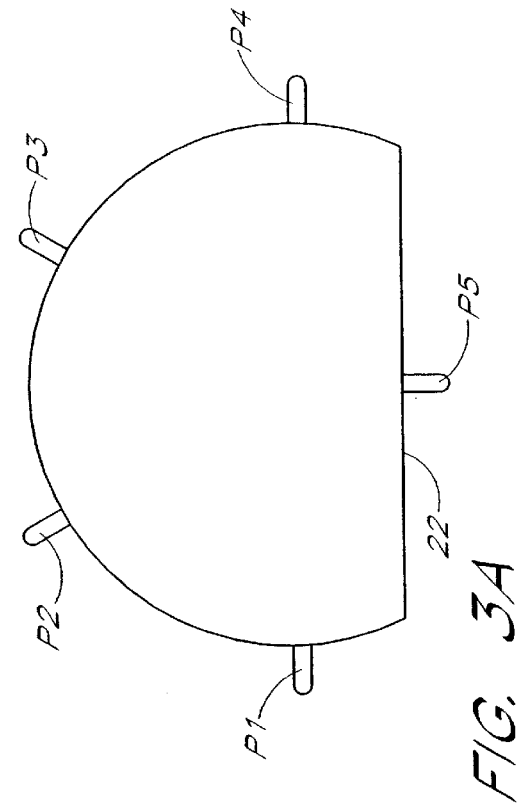

FIGS. 3A–3E show various views and details of a first embodiment of a multi-pole switch included in the combiner 22. The combiner 22 is hereinafter referred to as the multi-pole switch 22. The multi-pole switch 22 has a machine-tooled housing made of metal, e.g., an Al/Ni alloy. FIG. 3A shows a bottom view of the multi-pole switch 22 having four input ports P1, P2, P3, P4 and one output port P5. In the illustrated bottom view of the first embodiment, the multi-pole switch 22 is shaped as a circle with a segment removed through a straight line. The input ports P1–P4 are positioned on the circular circumference and the output port P5 is positioned along the straight line. The bottom surface may be an integral part of a body of the housing or a bottom cover attached to the body. In one embodiment, the bottom surface has a diameter of about 1.25 inches (about 3 cm).

FIG. 3B shows a side view of the multi-pole switch 22, wherein the input ports P1, P2 and the output port P5 are visible. Also visible is a part of a solenoid S1 that is assigned to the input port P1. The solenoid S1 is located within a recess 21 of the housing. The height of the housing of the multi-pole switch 22 is in one embodiment about 0.5 inches (about 1.2 cm).

Figure 3C:
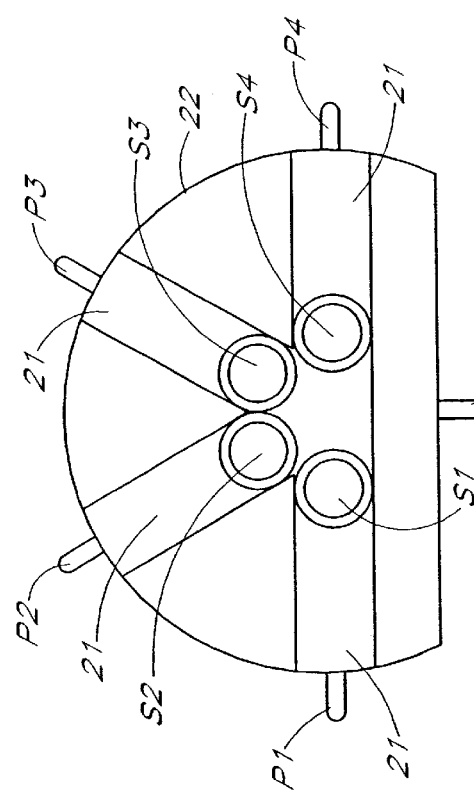

FIG. 3C shows a top view of the multi-port switch 22 with a top cover removed to show interior elements of the multi-port switch 22. In addition to the solenoid S1 that is assigned to the input port P1, three other solenoids S2, S3, S4 are assigned to their respective input ports P2, P3, P4. The solenoids S1–S4 are arranged in radially extending recesses 21 and along a circle around the center of the circular body of the housing. Each solenoid S1–S4, thus, has the same distance to the respective input port P1–P4 and to the output port P5. The solenoids S1–S4 are controllable to selectively connect the input ports P1–P4 to the output port P5 as described below in greater detail.

FIG. 3D is a front view of the multi-port switch 22, i.e., as seen from the straight line, wherein the input ports P1, P4 and the output port P5 are visible.

Figure 3E:
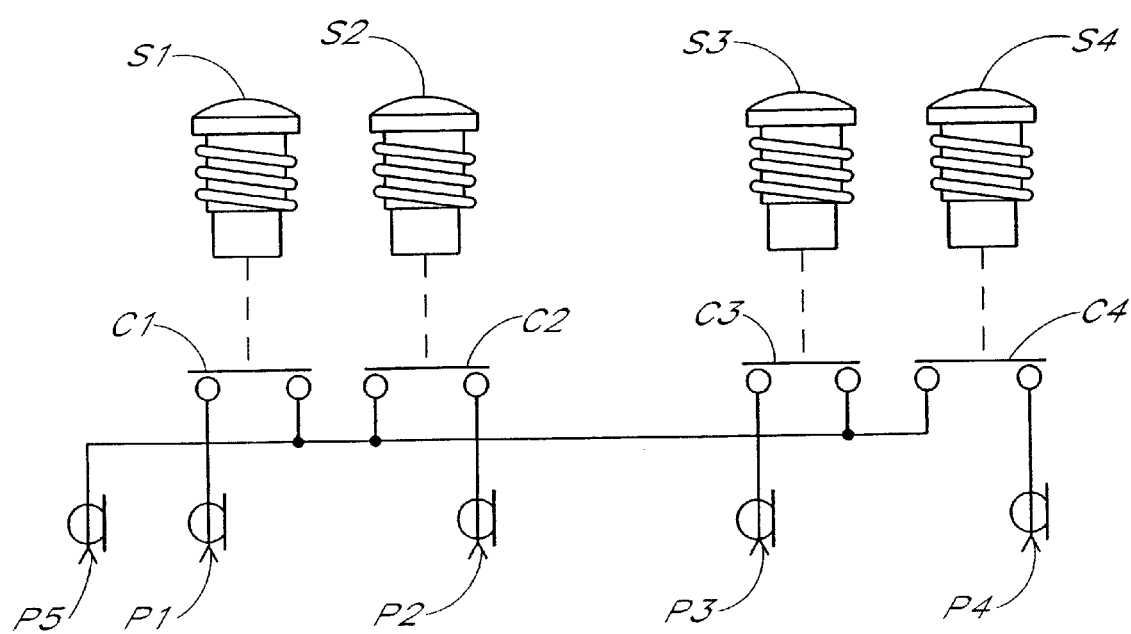

FIG. 3E illustrates an exemplary arrangement of the solenoids S1–S4 with switch contacts C1, C2, C3, C4 being assigned to the input ports P1–P4 and the output port P5. For instance, upon activation of the solenoid S1, the switch contact C1 connects the input port P1 to the output port P5.

Figure 4C:
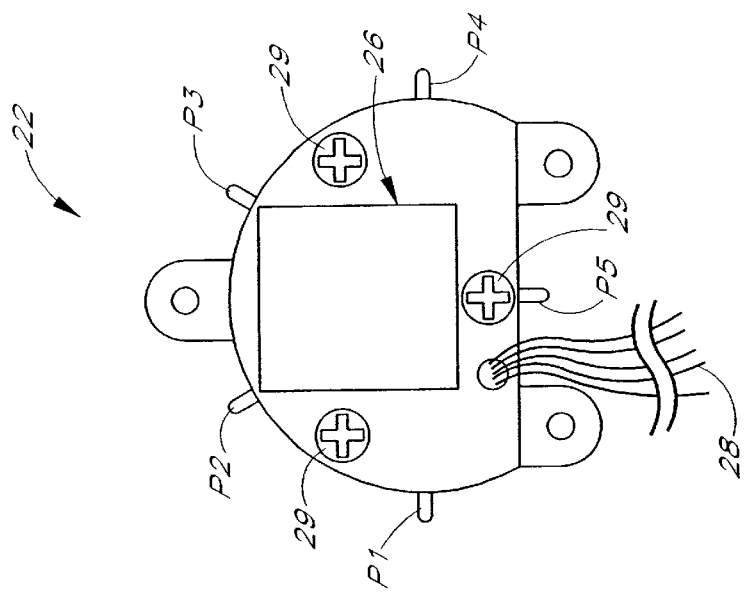
FIGS. 4A–4D show various views and details of a second embodiment of a multi-pole switch.
Figure 4B:
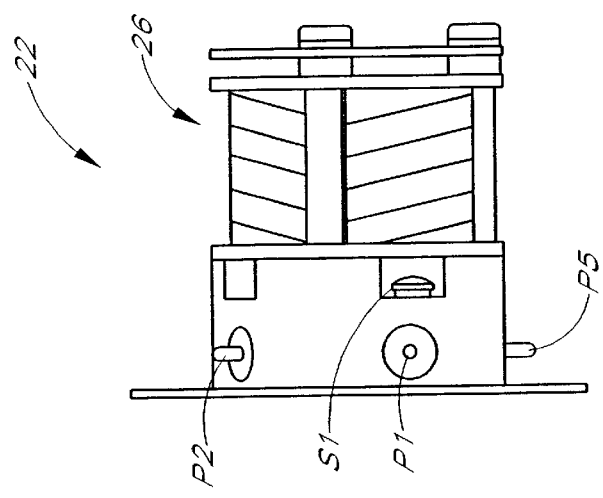
Figure 4A:
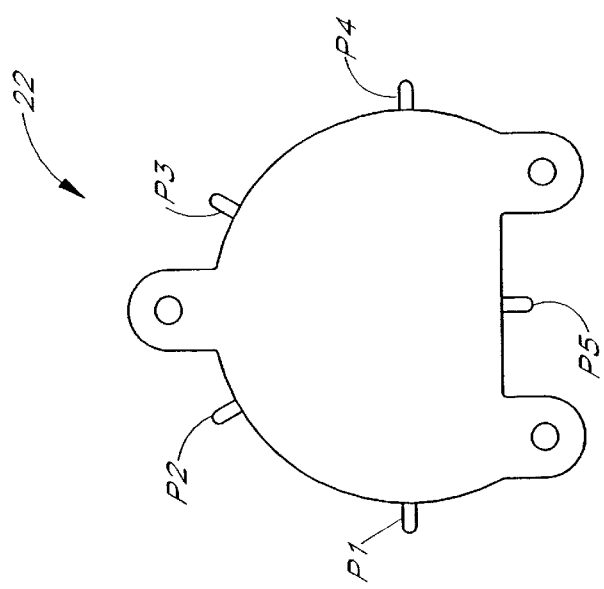

FIGS. 4A–4D show various views and details of a second embodiment of the multi-pole switch 22 which has also a machine-tooled housing made of metal, e.g., an Al/Ni alloy. FIG. 4A shows a bottom view of the multi-pole switch 22 having the four input ports P1, P2, P3, P4 and the output port P5. In this second embodiment, the multi-pole switch 22 is also shaped as a circle with a segment removed through a straight line. The input ports P1–P4 are positioned on the circular circumference and the output port P5 is positioned on the straight line. In addition, the multi-pole switch 22 has a bottom plate with openings, two along the straight line and one at the circular circumference, to secure the multi-pole switch 22 to a printed circuit board.

FIG. 4B shows a side view of the multi-pole switch 22, wherein the input ports P1, P2 and the output port P5 are visible. Also visible is the solenoid S1 that is assigned to the input port P1 and located within a recess of the housing. The housing is connected to a control device 26 which controls the solenoids S1–S4. In one embodiment, the control device 26, the solenoids S1–S4 and the multi-pole switch 22 form a multi-pole switch relay assembly.

Figure 10:
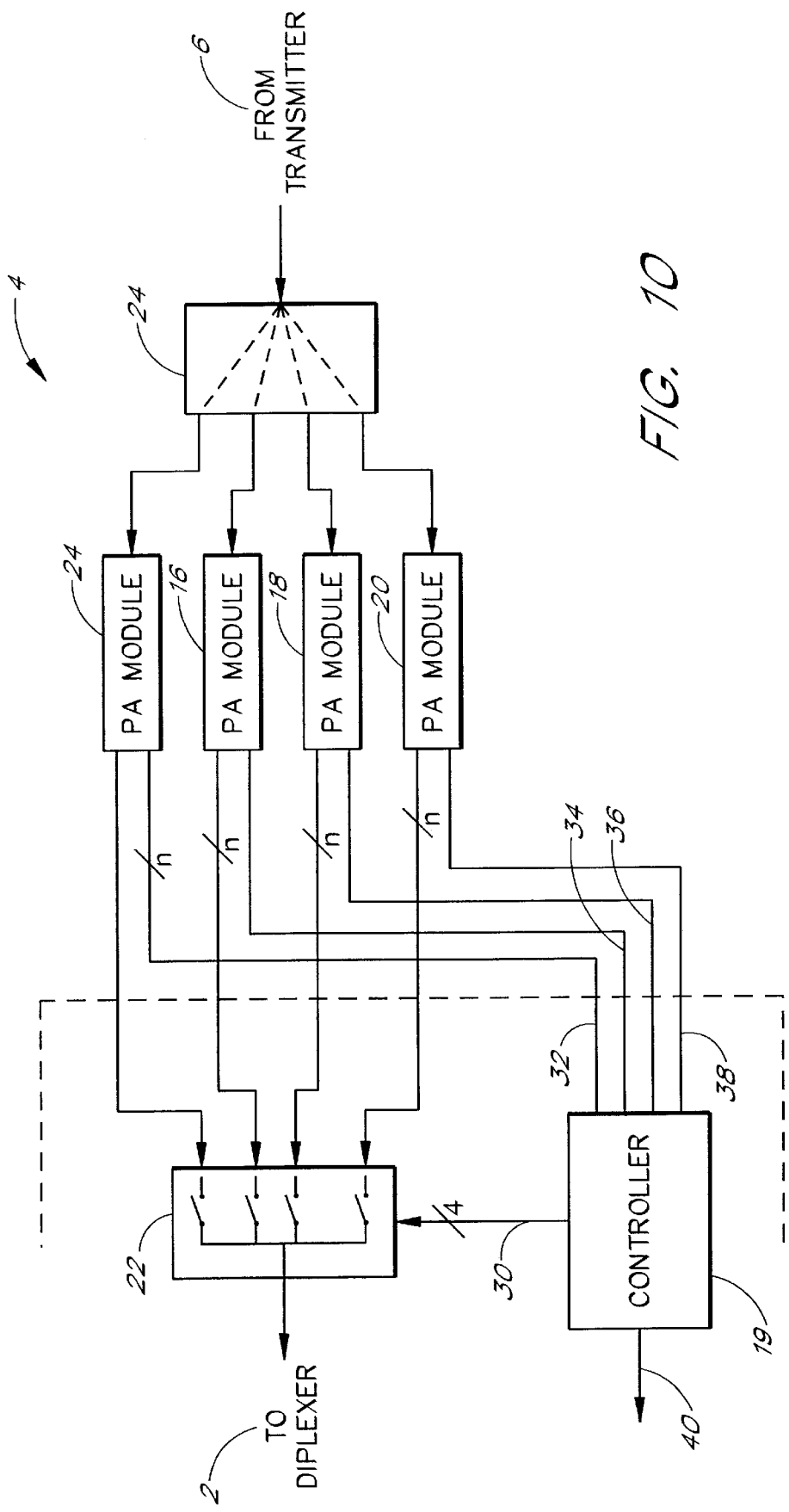
FIG. 10 is an illustration of an embodiment of a power amplifier section controlled by a controller and including the multi-pole switch in accordance with the present invention.

FIG. 4C shows a top view of the multi-port switch 22 with the control device 26 secured to the housing through screws 29. The control device 26 is controllable via control leads 28 connectable to a controller (FIG. 10).

Figure 4D:
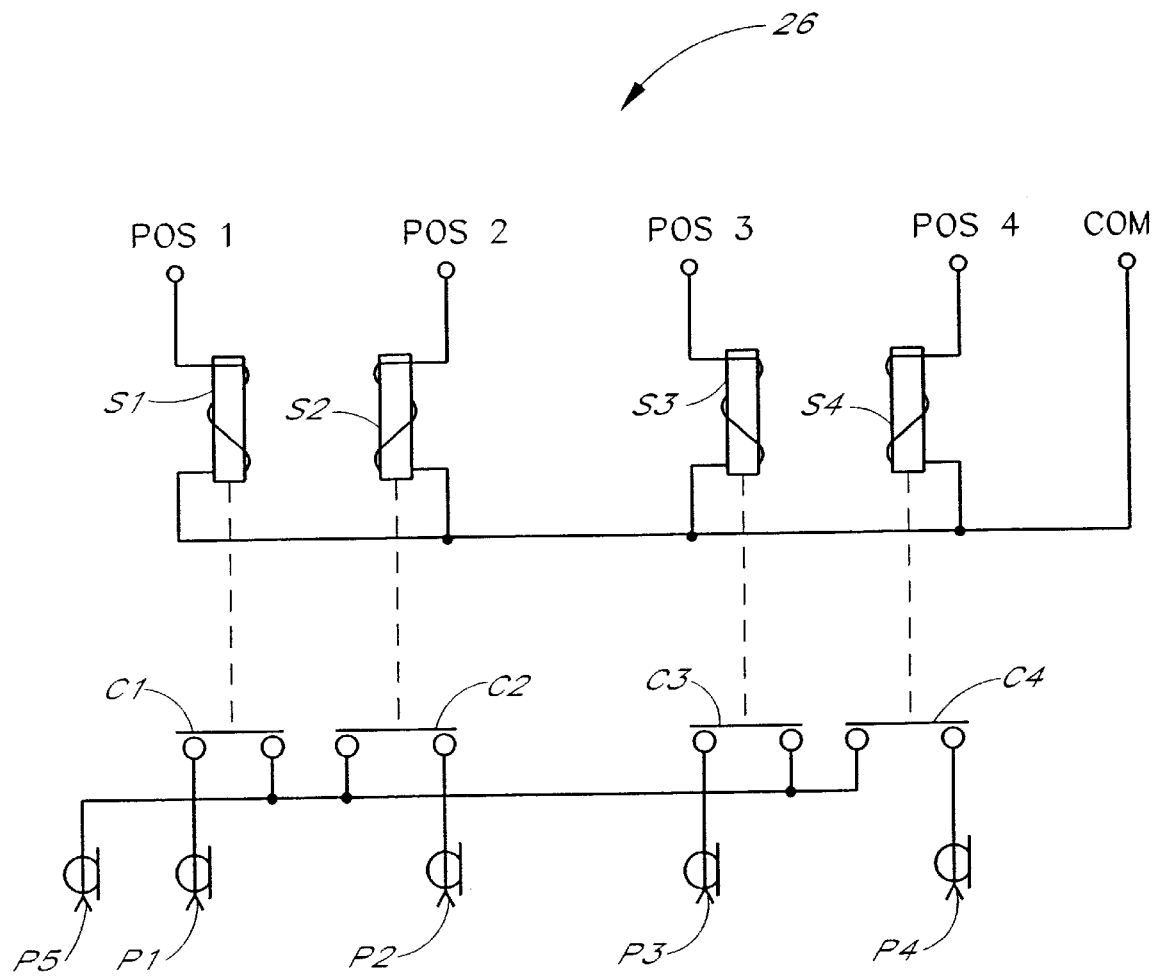

FIG. 4D illustrates an exemplary schematic of the control device 26 and the solenoids S1–S4. The solenoids S1–S4 and the switch contacts C1, C2, C3, C4 are indicated as in FIG. 3E. The operation of the solenoids S1–S4 is as described above.

Figure 5:
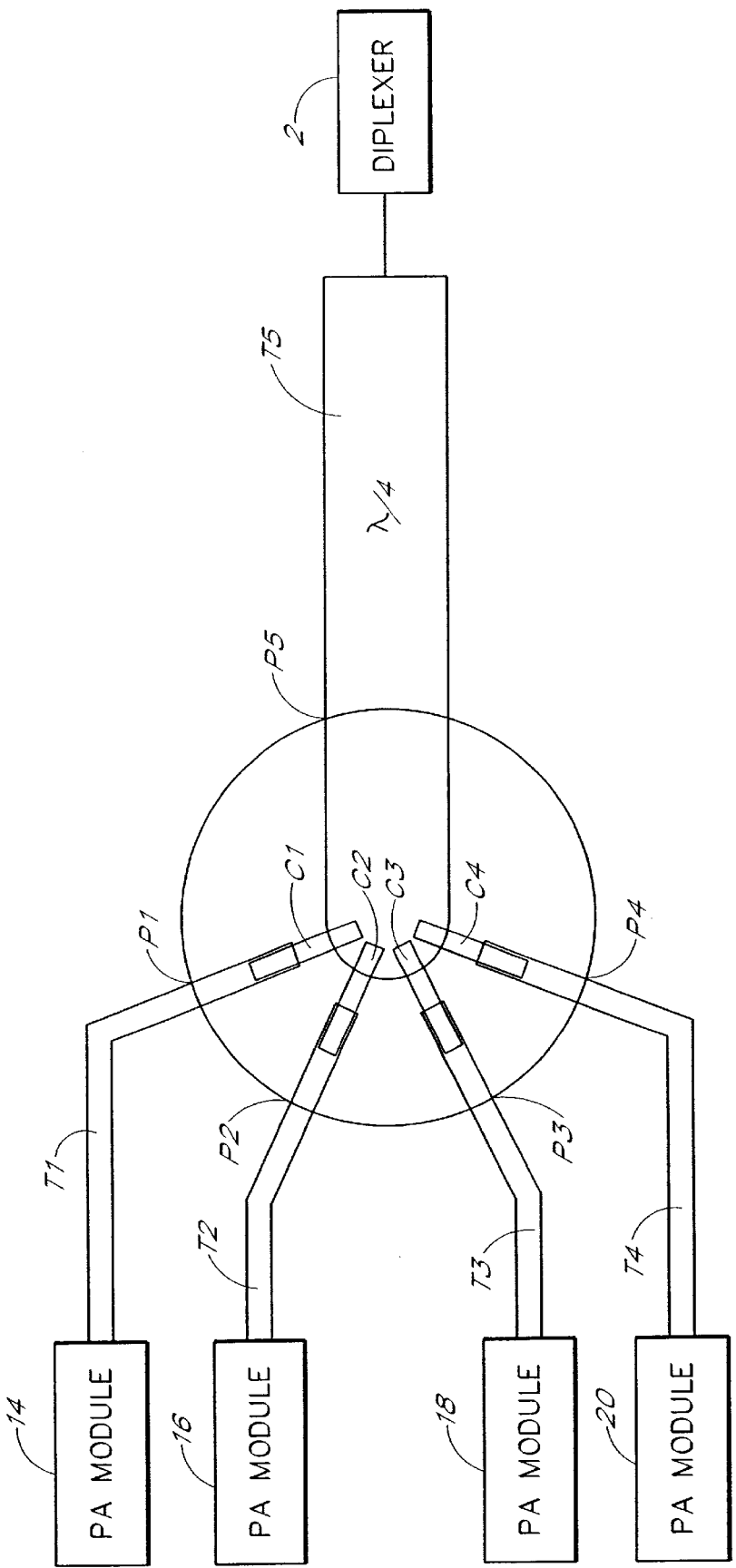
FIG. 5 is an illustration of an embodiment of the multi-pole switch coupled to the power amplifier module and a diplexer via transmission lines.

FIG. 5 is an illustration of the multi-pole switch 22 connected to the power amplifier module 14–20 via transmission lines T1, T2, T3, T4 connected to the input ports P1, P2, P3, P4. The output port P5 is connected to an impedance transformation line T5. The multi-pole switch 22 combines the signals from the power amplifier modules 14–20 to a sum signal at the summing junction and forwards the sum signal to the diplexer 2.

The multi-pole switch 22 has a nominal impedance of 50 ohms resulting in an impedance of 12.5 ohms (50 ohms/4) at the output port P5 when all switch contacts C1–C4 are closed. The impedance transformation line T5 is a one-quarter wavelength line (λ/4) having an impedance of 25 ohms. The impedance transformation line T5 transforms the impedance of 12.5 ohms to an impedance of 50 ohms according to transmission line theory. At a distal end of the impedance transformation line T5 the impedance is therefore 50 ohms and the impedance transformation line T5 may be coupled to a 50 ohm transmission line leading to the diplexer 2. If a mismatch of the impedances exists, additional tuning may be provided, for example, using reactive tuning elements. The transmission lines T1–T4 are in one embodiment 50-ohm lines.

An advantage of this embodiment is that the switching occurs at one location with respect to the summing junction. The mechanical construction of the multi-pole switch 22 is therefore simplified. For example, the (50-ohm) transmission lines T1–T4 may have any convenient length provided that all transmission lines T1–T4 have the same lengths.

Figure 6:
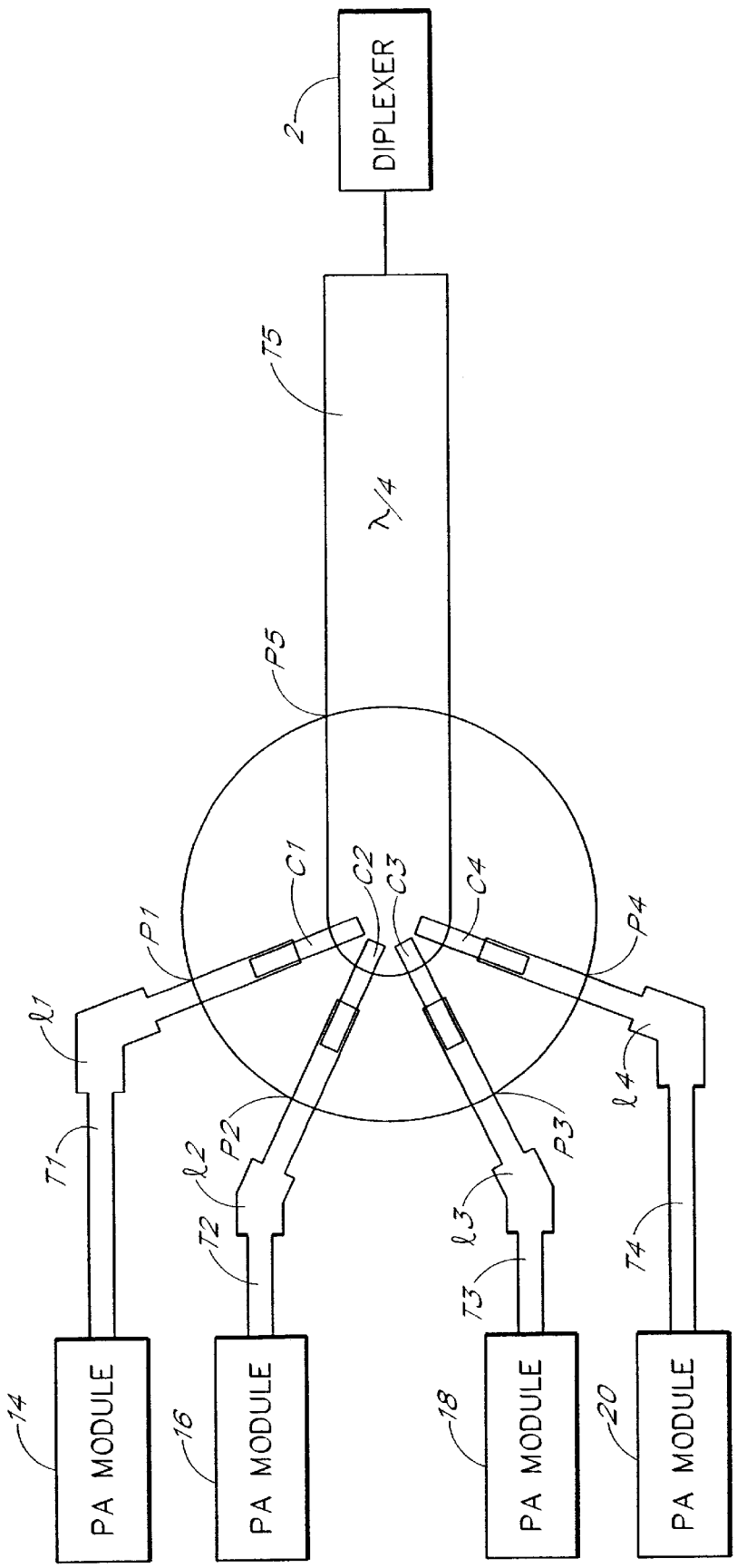
FIG. 6 is an illustration of an embodiment of the multi-pole switch coupled to impedance transformation lines.

FIG. 6 is an illustration of the multi-pole switch 22 connected to the power amplifier modules 14–20 and the diplexer 2 as described with reference to FIG. 5. In FIG. 6, however, each transmission line T1–T4 includes an impedance transformation line 11, 12, 13, 14, 15 that provides for an impedance transformation prior to summing the signals from the power amplifier modules 14–20. In the illustrated embodiment, the impedance transformation lines 11–15 are essentially located outside the multi-pole switch 22.

The impedance transformation lines 11–14 are one-quarter wavelength lines (λ/4) similar to the impedance transformation line T5 coupled to the output port P5,. In one embodiment, the impedance transformation lines 11–14, T5 are strip lines on a printed circuit board and used to transform a line impedance according to transmission line theory. In FIG. 6, the impedance transformation lines 11–14 are illustrated as having a greater width than the transmission lines T1–T4. It is contemplated that the impedance transformation lines 11–14 may have lengths that are multiples of a one-quarter wavelength. At frequencies typically used in mobile communications systems, the impedance transformation lines 11–14 have lengths between 1–2 inches (2.5–5 cm).

In one embodiment, the impedance transformation lines 11–14 provide that the RF signals from the power amplifier modules 14–20 "see" an input impedance at the input ports P1–P4 that is higher than a reference value of reference impedance. In the field of line transmission the reference value is typically 50 ohms and the signal transmission occurs over "50-ohm lines." The impedance transformation lines 11–14, thus, transform the input ports P1–P4 to input impedance levels that are higher than 50 ohms so that the impedance at the output port P5 is, for example, about 18 ohms ($[60/50]^2/4$) and, thus, is higher than 12.5 ohms (50/4) as described above with reference to FIG. 5.

The above combination of impedance transformation lines 11–14 is one example for achieving a desired impedance matching. Those skilled in the art will appreciate that other combinations of impedance transformation lines 11–14 are possible to achieve a desired matching.

Figure 7:
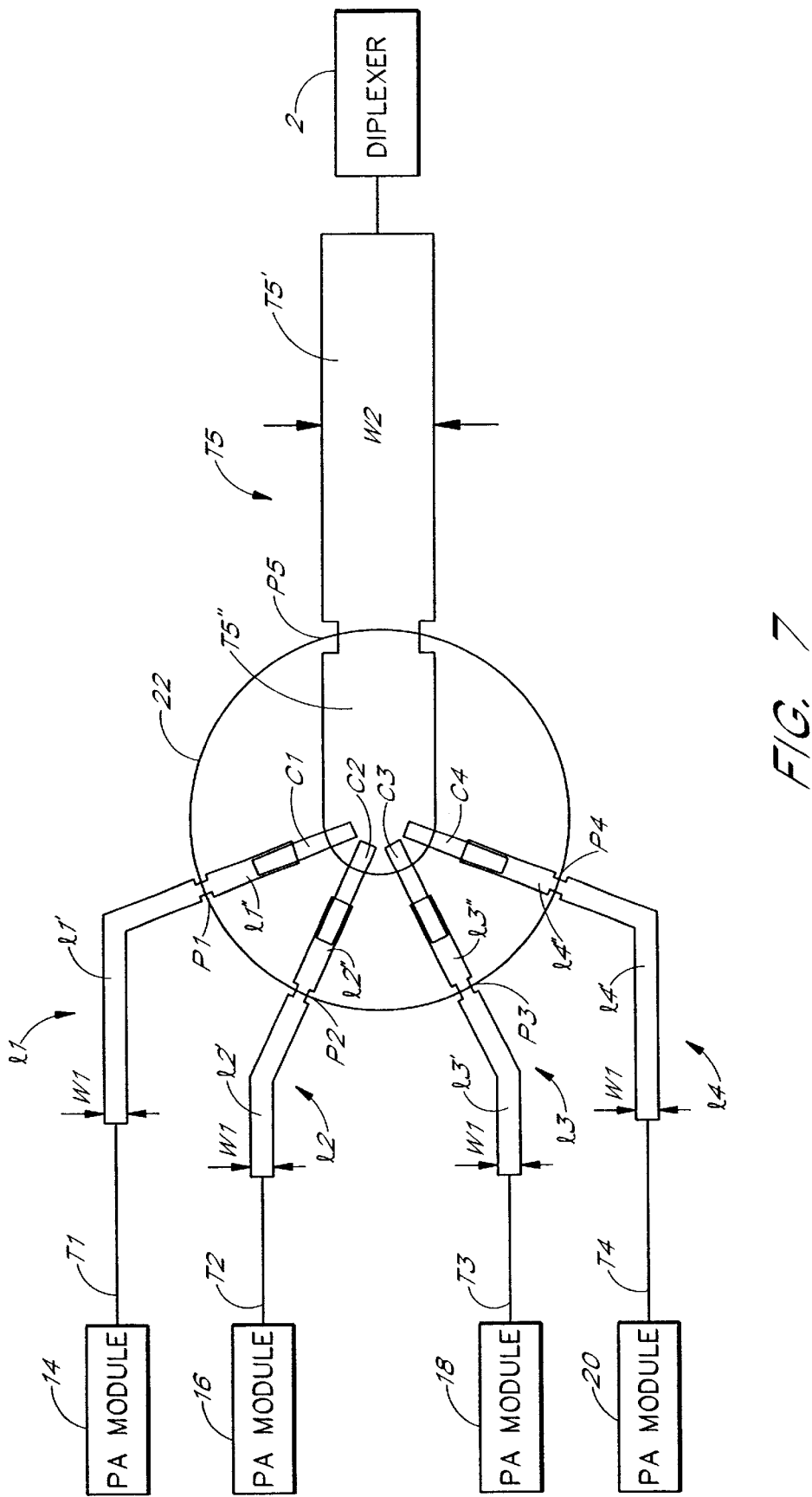
FIG. 7 is an illustration of an embodiment of the multi-pole switch having internal impedance transformation lines which are coupled to external impedance transformation lines.

In FIG. 6, the multi-pole switch 22 is a switch located at a junction where the signals from the power amplifier modules 14–20 join. The process of impedance transformation essentially occurs outside the multi-pole switch 22 through the transmission lines 11–14, T5. Those skilled in the art, however, will appreciate that depending on the frequency of the signal more or less impedance transformation occurs within the multi-pole switch 22. FIGS. 7 and 8 show embodiments of the present invention in which the multi-pole switch 22 is configured to take part in the impedance transformation process.

At higher frequencies, for example, as used in analog cellular mobile phone systems and in digital PCS systems, the dimension of the multi-pole switch 22 may be between about 20% and about 30% of the electrical length of an impedance transformation line 11–14. At these higher frequencies, the multi-pole switch 22 in accordance of the present invention significantly reduces any impedance discontinuities in the signal-combining path.

FIG. 7 illustrates an embodiment of the multi-pole switch 22 connected via the input ports P1, P2, P3, P4 to the respective impedance transformation lines 11–14 and via the output port P5 to the impedance transformation line T5. As in FIG. 6, the (50-ohm) transmission lines T1–T4 connect the impedance transformation lines 11–14 to the power amplifier module 14–20. The multi-pole switch 22 is modified so that a predetermined length of the impedance transformation lines 11–14 extends within the multi-pole switch 22. As indicated in FIG. 7, each transmission line 11–14 is divided at the respective input port P1, P2, P3, P4 into an external length 11', 12', 13', 14' and an internal length 11", 12", 13", 14". The impedance transformation line T5 is also shown as having an external length T5' and an internal length T5".

FIG. 7 further illustrates that the impedance transformation lines 11–14 connected to the input ports P1, P2, P3, P4 have a width w1 that is thinner than a width w2 of the impedance transformation line 15 connected to the output port P5. The widths w1, w2 illustrate different impedances.

The internal lengths 11"–14", T5" are embedded into the ports P1–P5 of the multi-pole switch 22 and provide impedance transformation within the multi-pole switch 22. The internal lengths 11"–14", T5" and the external lengths 11'–14', T5' taper towards the input ports P1–P4 and the output port P5, respectively. However, those skilled in the art will appreciate that these tapers are mainly for illustrative purposes and that a physical embodiment may not have such tapers.

FIG. 8 is an illustration of an embodiment of the multi-pole switch 22 that corresponds to the illustration shown in FIG. 7. In addition, however, the illustrated embodiment includes a switch contact C5 and a matching stub 16 (also referred to as tuning stub) located along the impedance transformation line T5 at a predetermined length away from the multi-pole switch 22. Those skilled in the art will appreciate that more than one matching stub 16 may be located along the impedance transformation line 15.

The switch contact C5 selectively connects the matching stub 16 to the impedance transformation line T5. Thus, as the signals change at the input ports P1, P2, P3, P4, one or more matching stubs 16 may be selectively switched in and out to improve the impedance matching and to reduce reflective loss of the multi-pole switch 22.

Figure 9:
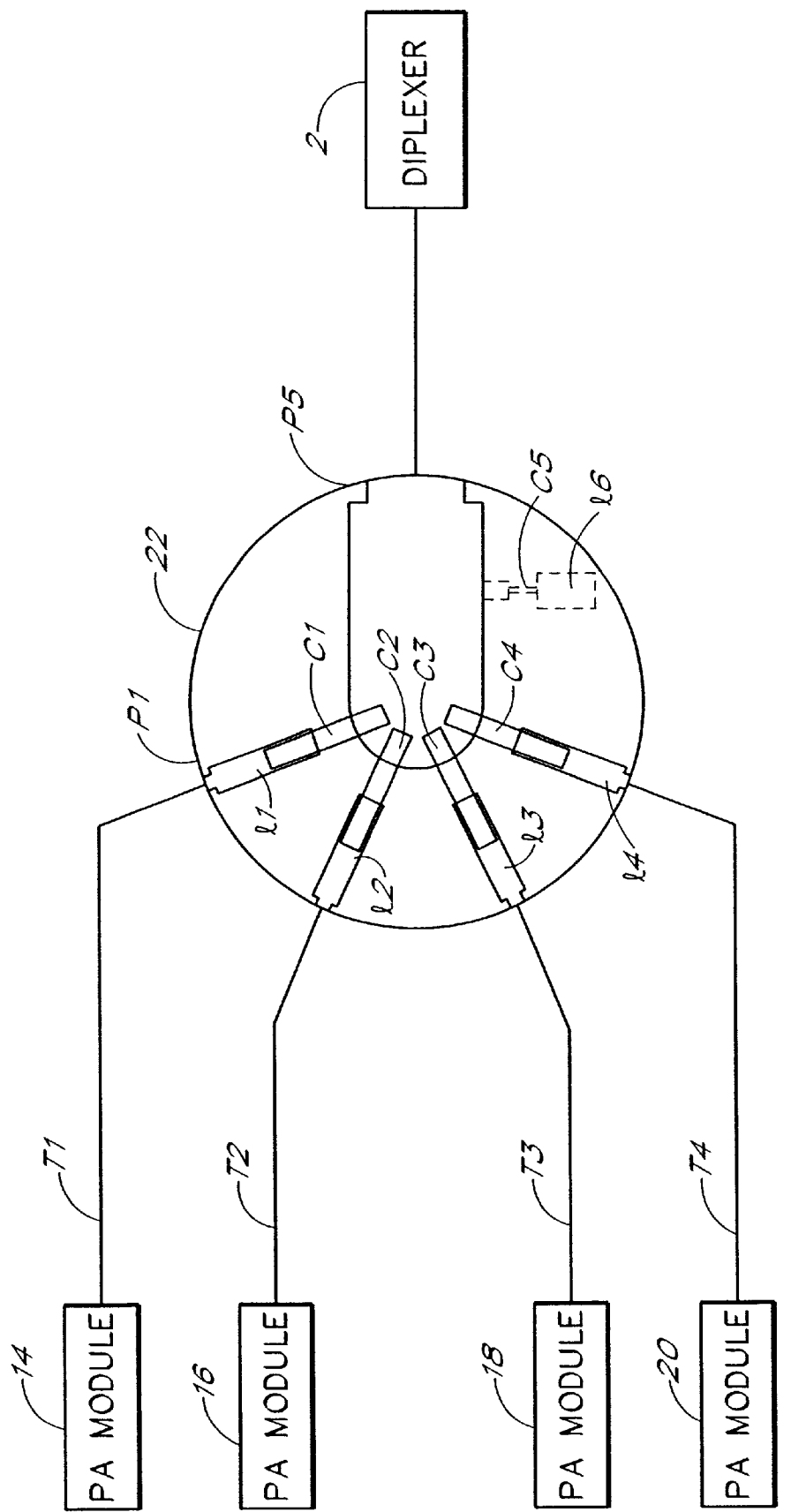
FIG. 9 is an illustration of an embodiment of an integrated switch assembly including the multi-pole switch and impedance transformation lines.

FIG. 9 shows an embodiment of an integrated switch assembly including the multi-pole switch 22 and impedance transformation lines 11–14, T5. Those skilled in the art will appreciate that the impedance matching process may take place completely within the multi-pole switch 22. The impedance transformation lines 11–14, T5 are therefore integrated within the multi-pole switch 22.

For example, at frequencies of about 2 GHz and above, the optimum location of the matching stub 16 may be so close to the summing junction of the multi-pole switch 22 that it is practicable to integrate the matching stub 16 into a switch assembly. As indicated through dashed lines, the multi-pole switch 22 may therefore include the matching stub 16 and the switch contact C5. Such a switch assembly includes the port-switching function of the multi-pole switch 22, the function of embedded port impedance transformation and the function of port selection matching provided by the matching stub 16.

The multi-pole switch 22 within an environment as shown in FIGS. 5, 6, 7, 8, 9 provides for loss-less combining of RF signals to a single RF output signal. For example, in case the power amplifier module 14 fails or is turned off, the combined power at the output port P5 drops about 25% because of the missing input power. However, the multi-pole switch 22 in accordance of the present invention provides that the combined power does not drop more than 25%.

FIG. 10 is an illustration of the power amplifier section 4 controlled by a controller 19. In addition to the flow of the RF signals shown in FIG. 2, FIG. 8 shows the flow of control signals between the power amplifier modules 14–20, the multi-pole switch 22 and the controller 19. The structure of the power amplifier section 4 is as shown in FIG. 2 and described above.

The controller 19 is connected to the multi-pole switch 22 through a control line 30 and to the power amplifier modules 14–20 through control lines 32, 34, 36, 38, respectively. The control line 30 has at least four channels to control the four solenoids S1–S4 of the multi-pole switch 22. Each control line 32, 34, 36 and 38 also has several channels to convey control signals and status signals between the power amplifier module 14–20 and the controller 19. Further, a control line 40 connects the controller 19 to a central processor of the base station.

The controller 19 controls the power amplifier section 4 of the base station 1 as a function of control signals and status signals received from the central processor. For instance, the controller 19 detects how many power amplifier modules 14–20 are initially present. This may be done through short pins at the controller 19. Further, the controller 19 is configured to selectively enable and disable the power amplifier modules 14–20. Based on the status of each power amplifier module 14–20 and on the control signals and status signals received from the central processor the controller 19 operates the multi-pole switch 22.

In operation, the controller 19 continuously monitors the operation of the power amplifier section 4. For instance, the controller 19 detects if a power amplifier module 14–20 has failed as part of an automatic failure control system. Further, the controller detects if a system operator intervened and deactivated one of the power amplifier modules 14–20. The system operator may put a power amplifier module 14–20 off line to minimize power consumption during periods of inactivity, for example, during the early morning hours.

In one embodiment, the power amplifier section 4 may be configured to provide for automatic impedance matching when a power amplifier module 14–20 fails or is added or removed. Open stubs of impedance transformation lines may be located in proximity of the multi-pole switch 22. For instance, when a power amplifier module 14–20 is added, the controller 19 automatically switches one or more of the stubs into the RF signal path to provide for optimized impedance matching and, thus, to minimized any reflective loss the multi-pole switch 22 may have.

The controller 19 may be located within the power amplifier section 4 or at other locations within the base station 1. The controller 19 may be implemented in "hardware" using integrated circuits, active and passive components, and logic gates. Those skilled in the art will appreciate that the functionality of the controller 19 may also be implemented in a software module or as firmware.

While the above detailed description has shown, described and identified several novel features of the invention as applied to a preferred embodiment, it will be understood that various omissions, substitutions and changes in the form and details of the described embodiments may be made by those skilled in the art without departing from the spirit of the invention. Accordingly, the scope of the invention should not be limited to the foregoing discussion, but should be defined by the appended claims.

What is claimed is:

1. A switch assembly, comprising:
   a housing having a plurality of input ports and an output port;
   a plurality of controllable contacts arranged within the housing to form a multi-pole switch, each contact having an open position and a closed position and being coupled to one of a plurality of input ports of the housing and a common summing junction within the housing of the multi-pole switch, each input port configured to receive a radio frequency (RF) signal, wherein the output port is coupled to the common summing junction and configured to output a sum signal that includes at least one of the RE signals received at the common summing junction when a contact is in the closed position; and
   an impedance transformation line coupled at a first end to the common summing junction and configured to provide for a predetermined impedance value at a second end.

2. The switch assembly of claim 1, further comprising at least one transmission line connected to at least one of the input ports, wherein an impedance of the input port matches an impedance of the transmission line.

3. The switch assembly of claim 1, wherein each contact is independently operable.

4. The switch assembly of claims 1, wherein the contacts are simultaneously operable.

5. The switch assembly of claim 1, wherein the RF signals are coherent RF signals.

6. A method of matching impedances of transmission lines using a switch assembly including a multi-pole switch, comprising:

receiving at a plurality of input ports radio frequency (RE) signals;

selectively operating contacts of the multi-pole switch between open positions and closed positions to selectively couple the RE signals to a common summing junction within the multi-pole switch;

outputting a sum signal at an output port that includes at least one of the RE signals; and transforming a first impedance at the output port to a second impedance.

7. An amplifier section for amplification of a radio frequency (RF) signal, comprising:

amplifier modules, each amplifier module having an input port to receive the RE signal and an output port for an amplified RE signal, the input ports being connectable to a splitter; and a combiner having input ports each being coupled to an output port of an amplifier module to receive the amplified RE signal and an output port for a single RE signal formed by a combination of the amplified RE signals at a summing junction, the combiner having a multi-pole switch with controllable contacts at the summing junction within the multi-pole switch, each contact assigned to one of the amplifier modules to selectively connect and disconnect the amplifier module.

8. The amplifier section of claim 7, further comprising an impedance transformation line connected to the output port of the combiner and configured to transform an output impedance value at the output port of the combiner to a reference impedance value of a reference line at a distal end of the impedance transformation line, wherein the output impedance value at the output port of the combiner is lower than the reference impedance value.

9. The amplifier section of claim 8, wherein the impedance transformation line has a length of about one-quarter wavelength.

10. The amplifier section of claim 7, wherein the amplifier module comprises four power amplifiers, and wherein the combiner comprises four contacts.

11. The amplifier section of claim 10, wherein the contacts, the output port and the input ports of the combiner are positioned in a circular arrangement so that the input ports are equidistant from the contacts.

* * * * *

UNITED STATES PATENT AND TRADEMARK OFFICE
CERTIFICATE OF CORRECTION

PATENT NO. : 6,587,014 B2　　　　　　　　　　　　　　　　　　　　　Page 1 of 1
DATED : July 1, 2003
INVENTOR(S) : Thinh Dat Do et al.

It is certified that error appears in the above-identified patent and that said Letters Patent is hereby corrected as shown below:

<u>Column 10,</u>
Line 43, after "port;" add -- and. --
Line 53, delete "RE" and insert -- RF. --

<u>Column 11,</u>
Lines 6, 10, 14, 20, 21 and 26, delete "RE" and insert -- RF. --
Line 25, delete the first "RE" and insert -- RF. --
Line 25, delete the second "RE" and insert -- RF. --

Signed and Sealed this

Thirtieth Day of March, 2004

JON W. DUDAS
*Acting Director of the United States Patent and Trademark Office*